(12) United States Patent
Tsuji et al.

(10) Patent No.: US 8,138,606 B2
(45) Date of Patent: Mar. 20, 2012

(54) WIRING CONDUCTOR, METHOD FOR FABRICATING SAME, TERMINAL CONNECTING ASSEMBLY, AND PB-FREE SOLDER ALLOY

(75) Inventors: Takayuki Tsuji, Hitachi (JP); Hiroshi Yamanobe, Hitachi (JP); Hajime Nishi, Hitachi (JP); Takeshi Usami, Hitachi (JP); Seigi Aoyama, Kitaibaraki (JP); Masato Ito, Hitachi (JP); Hiroshi Okikawa, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 340 days.

(21) Appl. No.: 11/784,365

(22) Filed: Apr. 6, 2007

(65) Prior Publication Data
US 2007/0235207 A1    Oct. 11, 2007

(30) Foreign Application Priority Data

Apr. 6, 2006   (JP) .................................. 2006-105452
Jul. 12, 2006  (JP) .................................. 2006-191579

(51) Int. Cl.
*H01L 23/48*    (2006.01)
*H01L 23/52*    (2006.01)
(52) U.S. Cl. ........................................ 257/772; 257/784
(58) Field of Classification Search .................. 257/737, 257/738, 772, 778, E23.021, E23.025, 784
See application file for complete search history.

(56) References Cited

U.S. PATENT DOCUMENTS

| 6,195,248 | B1 | 2/2001 | Kunishi et al. |
| 7,173,188 | B2 | 2/2007 | Endo et al. |
| 7,282,175 | B2 | 10/2007 | Amagai et al. |
| 2002/0071961 | A1 | 6/2002 | Miura |
| 2004/0262779 | A1 | 12/2004 | Amagai et al. |
| 2005/0025990 | A1* | 2/2005 | Laurello et al. ............... 428/610 |
| 2005/0039943 | A1 | 2/2005 | Endo et al. |
| 2005/0211461 | A1 | 9/2005 | Horikoshi et al. |
| 2007/0295528 | A1* | 12/2007 | Nishi et al. ................. 174/126.4 |
| 2008/0246164 | A1 | 10/2008 | Ueshima |

FOREIGN PATENT DOCUMENTS

| JP | 11-189894 | 7/1999 |
| JP | 11-345737 | 12/1999 |
| JP | 2001-009587 | 1/2001 |
| JP | 2001-230151 | 8/2001 |
| JP | 2002-53981 | 2/2002 |
| JP | 2004-137574 | 5/2004 |

(Continued)

OTHER PUBLICATIONS

Chinese Official Action dated Mar. 11, 2010, together with English translation. Japanese Office Action dated Aug. 2, 2011 in connection with Japanese Patent Application 2006-191579 a foreign counterpart of the subject application together with English translation.

*Primary Examiner* — Hung Vu
(74) *Attorney, Agent, or Firm* — Scully, Scott, Murphy & Presser PC

(57) ABSTRACT

A Pb-free Sn-based material part of a wiring conductor is provided at least at a part of its surface, and the Sn-based material part includes a base metal doped with an oxidation control element. The oxidation control element is at least one element selected from a group consisted of P, Ge, K, Zn, Cr, Mn, Na, V, Si, Ti, Al, Li, Mg and Ca. The wiring conductor is reflow processed, such that at least one of the Sn and the oxidation control element is diffused to form an alloy.

23 Claims, 6 Drawing Sheets

FOREIGN PATENT DOCUMENTS

| | | |
|---|---|---|
| JP | 2004-156094 | 6/2004 |
| JP | 2004-261863 A | 9/2004 |
| JP | 2005-002368 A | 1/2005 |
| JP | 2005-050780 A | 2/2005 |
| JP | 2005-206869 | 8/2005 |
| JP | 2005-216749 | 8/2005 |
| JP | 2006-45665 | 2/2006 |
| JP | 2006-086513 A | 3/2006 |
| WO | WO 2005/119755 A1 | 12/2005 |
| WO | 2006/006534 | 1/2006 |

* cited by examiner

WIRING CONDUCTOR, METHOD FOR FABRICATING SAME, TERMINAL CONNECTING ASSEMBLY, AND PB-FREE SOLDER ALLOY

The present application is based on Japanese Patent Application No. 2006-105452 filed on Apr. 6, 2006 and Japanese Patent Application No. 2006-191579 filed on Jul. 12, 2006, the entire contents of which are incorporated herein by reference.

BACKGROUND OF THE INVENTION

1. Field of the Invention

The present invention relates to a wiring conductor, a method for fabricating the same, a terminal connecting assembly, and a Pb-free solder alloy, in more particular, to a wiring conductor, a method for fabricating the same, a terminal connecting assembly, and a Pb-free solder alloy used for electronic devices.

2. Description of the Related Art

Conventionally, a plating of tin, silver, gold or nickel is provided on a wiring material, in particular, on a surface of copper or copper alloy, so as to prevent the wiring material from oxidation. For example, as shown in FIG. 7, the plating is provided on a connector pin (metal terminal) 12 of a connector (connector member) 11 and on a surface of a conductor 14 of a flexible flat cable (hereinafter, referred as "FFC") 13, in a terminal connecting assembly (terminal connecting part) for connecting the connector 11 and FFC 13. Among the materials for plating, Sn is advantageous since the cost is low, and Sn is easily transformed by a pressure caused by fitting (contact pressure), so that a contact area increases and a contact resistance can be kept low. Therefore, the wiring material on which the Sn-plating is provided at its surface is generally and broadly employed.

For the alloy for such a Sn-plating, a Sn—Pb alloy having an excellent whisker resistance property has been conventionally used. Herein, the "whisker" is a needle-like crystal of Sn, which is generated when a stress is applied to a Sn-based material part. However, in late years, use of Pb-free materials (non-lead materials) and non-halogen materials is requested from the viewpoint for addressing the environmental concerns. Therefore, application of the Pb-free materials and non-halogen materials is demanded for various materials employed for the wiring materials.

In addition, in the field of the solder, the Sn—Pb alloy has been used conventionally, however, a Pb-free solder such as Sn—Ag—Cu-based material is now put to practical use.

The conventional arts are disclosed by Japanese Patent Laid-Open No. 11-189894, Japanese Patent Laid-Open No. 11-345737, Japanese Patent Laid-Open No. 2001-9587, Japanese Patent Laid-Open No. 2001-230151, and Japanese Patent Laid-Open No. 2002-53981.

However, in accordance with the application of Pb-free Sn-plating, a whisker which is a needle like crystal of Sn are generated from the plating particularly in Sn-plating or Sn-based alloy plating. As shown in FIG. 8, there is a risk that adjacent wiring materials (conductors 14) are short-circuited by whiskers 21.

It is assumed that the generation of the whisker can be reduced by conducting a reflow process on the Sn-plating provided by electroplating, so as to relax a stress in the Sn-plating that is believed as one of origins of the whisker.

However, a mechanism of suppressing the whisker is not understood precisely. Further, in the case where an additional external stress is applied when the Sn-plated wiring conductor is fitted into a connector, even if the reflow process is conducted, the generation of the whisker cannot be suppressed. In addition, the whisker can be suppressed by electrolysis plating of a Sn—Bi alloy, a Sn—Ag alloy or the like. However, it is reported that there is reversely more whiskers than the case of using a pure Sn-plating, when the reflow process is conducted. Since the reflow process is indispensable for mounting components in the case of manufacturing the electronic parts, there are problems in such an alloy plating. A method of providing a thin Sn-plating having a thickness of not more than 1 μm is disclosed as an effective solution for the present. However, there is a problem in that a contact resistance increases more than that of the conventional device, in particular, when being left in an environment at a high temperature (For example, see the document on the report meeting of the emergency proposal for the roadmap of JEITA lead free promotion (2005.2.17), JEITA lead-free solder practical use analysis 2005 result report (2005.6), Japanese Patent Laid-Open No. 2005-206869, Japanese Patent Laid-Open No. 2006-45665).

In addition, the generation of the whisker is concerned in accordance with the development of Pb-free in the Sn-based alloy solder.

SUMMARY OF THE INVENTION

Accordingly, for solving the above problems, the object of the present invention is to provide a wiring conductor, a method for fabricating the same, a terminal connecting assembly, and a Pb-free solder alloy used for electronic devices, in which there is a little risk of generation of the whisker or the whisker hardly occurs at a surface of a Sn-plating film and a surface of a solder around a conductor in the environment where a large external stress is applied by a fitting part or a connecting part to be connected with a connector, and a contact resistance is not increased in the elevated temperature environment.

According to a first feature of the invention, a wiring conductor comprises:

a Pb-free Sn-based material part provided at least at a part of its surface, the Sn-based material part comprising a base metal doped with an oxidation control element comprising at least one element selected from a group consisted of P, Ge, K, Zn, Cr, Mn, Na, V, Si, Ti, Al, Li, Mg and Ca;

in which at least one of the Sn and the oxidation control element is diffused.

In the wiring conductor, it is preferable that at least one of the Sn and the oxidation control element is diffused by a reflow process.

The wiring conductor may further comprises at least one of Ti and Zr as the oxidation control element.

In the wiring conductor, the oxidation control element may be contained in an outer layer provided at an outer periphery of the Sn-based material part.

In the wiring conductor, the oxidation control element may be contained in an inner layer provided at an inner periphery of the Sn-based material part.

In the wiring conductor, it is preferable that a total doping amount of the oxidation control element doped to the base metal of the Sn-based material part is not more than 10 wt %.

The wiring conductor may further comprise:

a core composed of Cu-based material;

in which the core is coated with a coating layer composed of the Sn-based material part.

In the wiring conductor, the wiring conductor may be provided as a Pb-free solder material or brazing-filler material totally composed of the Sn-based material part.

According to a second feature of the invention, a wiring member comprises:

a terminal comprising a wiring conductor;

in which the wiring conductor comprises a Pb-free Sn-based material part at least at a part of its surface, the Sn-based material part comprises a base metal doped with an oxidation control element comprising at least one element selected from a group consisted of P, Ge, K, Zn, Cr, Mn, Na, V, Si, Ti, Al, Li, Mg and Ca, and at least one of the Sn and the oxidation control element is diffused.

The wiring member may be a flexible flat cable. The wiring member may be a connector having a connector pin as the terminal. According to a third feature of the invention, a connecting assembly comprises:

a terminal to be connected to another terminal, at least one of the terminals comprising a wiring conductor, in which the wiring conductor comprises a Pb-free Sn-based material part provided at least at a part of its surface, the Sn-based material part comprises a base metal doped with an oxidation control element comprising at least one element selected from a group consisted of P, Ge, K, Zn, Cr, Mn, Na, V, Si, Ti, Al, Li, Mg and Ca, and at least one of the Sn and the oxidation control element is diffused.

According to a fourth feature of the invention, a Pb-free solder alloy comprises:

Ag of 0.1 to 3.5 wt %;

Cu of 0.1 to 3.5 wt %;

an oxidation control element of not more than 10 % wt, which comprises at least one element selected from a group consisted of P, Ge, K, Zn, Cr, Mn, Na, V, Si, Ti, Al, Li, Mg, Ca and Zr; and Sn as a remaining part.

According to a fifth feature of the invention, a wiring conductor comprises:

a composite material of a Pb-free Sn-based material part provided at least at its surface and a metallic material as a core; in which a base metal of the Sn-based material part is doped with at least one element selected from a group consisted of P, Zn, Al, Ti, and V.

In the wiring conductor, the base metal of the Sn-based material part may comprise a Pb-free solder material or brazing-filler material comprising a pure Sn-based material composed of Sn and inevitable impurities, a Sn—Ag based material, a Sn—Ag—Cu-based material, a Sn—Bi based material, a Sn—Bi—Ag based material, or a Sn—Cu-based material.

In the wiring conductor, it is preferable that a doping amount of an element doped to the base metal of the Sn-based material part is from 0.002 to 0.5 wt % when the element is P or Zn.

In the wiring conductor, it is preferable that a doping amount of an element doped to the base metal of the Sn-based material part is from 0.002 to 0.008 wt % when the element is Al.

In the wiring conductor, it is preferable that a doping amount of an element doped to the base metal of the Sn-based material part is from 0.002 to 0.5 wt % when the element is Ti.

In the wiring conductor, it is preferable that a doping amount of an element doped to the base metal of the Sn-based material part is from 0.002 to 0.1 wt % when the element is V.

In the wiring conductor, the core may comprise a metallic material comprising a conductive material having a conductance of not less than 10% IACS, an oxygen-free copper, a tough pitch copper, a silver, a nickel, a Cu-based alloy material, a Ni-based alloy base metal, an Al-based alloy material or a Fg-based alloy material.

In the wiring conductor, the core may comprise a circular wire rod, a rectangular wire rod, a plate material, a strip material, or a foil material.

According to a sixth feature of the invention, a method for fabricating a wiring conductor comprises the steps of:

forming a core comprising a metallic material; and coating around the core with a Pb-free Sn-based material part, the Sn based material part comprising a base metal doped with an oxidation control element comprising at least one element selected from a group consisted of P, Ge, K, Zn, Cr, Mn, Na, V, Si, Ti, Al, Li, Mg and Ca, by fusion-welding method or electrolysis plating method; and diffusing at least one of the Sn and the oxidation control element by a reflow process.

According to the present invention, it is possible to reduce a stress generated in a Pb-free Sn-based material part of a wiring conductor provided at least at a part of a surface of the wiring conductor. As a result, the generation of the whisker can be suppressed, so that defects such as a short circuit between adjacent wirings in a wiring material for electronic devices can be solved. In addition, there is no risk of losing the contact reliability at a high temperature leaving environment.

BRIEF DESCRIPTION OF THE DRAWINGS

The present invention will be explained in more detail in conjunction with appended drawings, wherein.

DESCRIPTION OF THE PREFERRED EMBODIMENTS

Preferred embodiments according to the present invention will be explained in detail hereinafter by referring to the appended drawings.

The whisker is a needle like crystal of Sn as described above. As for the generation of the whisker, it is assumed as one of the causes that a wiring conductor having a Sn-based material part at its surface expands (i.e. a diameter of the wiring conductor is increased) due to an oxide film formed at a surface of Sn, so that a compressive stress occurs therein. Inventors of the present invention zealously studied this problem. As a result of the studies, they found that the generation of the whisker can be controlled by preventing Sn from being oxidized by doping Sn with an oxidation control element.

Figure 1:
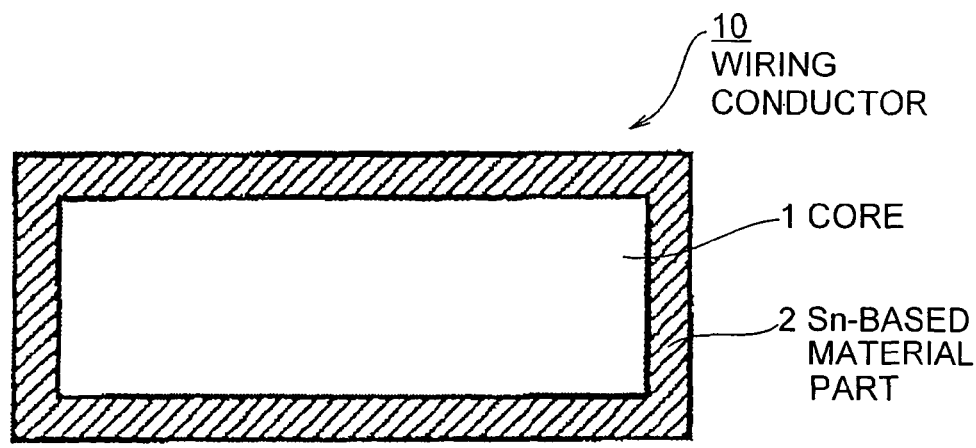
FIG. 1 is a cross sectional view along a widthwise direction of a wiring conductor in a first preferred embodiment according to the present invention.

FIG. 1 is a cross sectional view along a widthwise direction of a wiring conductor in the preferred embodiment according to the present invention. As shown in FIG. 1, a wiring conductor 10 comprises a conductive material (core) 1, and a Sn-based material part (coating layer) 2 for plating the core 1 at its periphery. The wiring conductor 10 is characterized by that the Sn-based material part 2 is composed of a Sn-based material part base metal doped with an oxidation control element for preventing the oxidation, and at least the Sn-based material part 2 is reflow processed, such that Sn and/or the oxidation control element is diffused by the reflow process. The "oxidation control element" here is an element for preventing the Sn-based material part base metal from being oxidized.

As for the Sn-based material part base metal, a pure Sn or a Pb-free solder (for example, Sn—Ag—Cu alloy) may be used.

As for the oxidation control element doped to the Sn-based material part base metal, at least one element selected from a group consisted of P, Ge, K, Zn, Cr, Mn, Na, V, Si, Ti, Al, Li, Mg, Ca, and Zr may be used. When the Sn-based material part base metal is the pure Sn, it is preferable to use P, Cr, V, Ti, Ge, Al, Mg, or Zn as for the oxidation control element, since they are excellent in the whisker resistance property (effect of suppressing the generation of the whisker). On the other hand, when the Sn-based material part base metal is the Pb-free solder, it is preferable to use P, Cr, Al, or Zn as for the oxidation control element.

A total doping amount of the oxidation control element doped to the Sn-based material part base metal is not more than 10 wt %. When the doping ratio of the oxidation control element in the Sn-based material part 2 exceeds 10 wt %, there will be defects such as generation of cracks, deterioration of solderability, or the like. Therefore, the doping ratio is not more than 10 wt %, preferably not more than 1.0 wt %, and more preferably not more than 0.1 wt %.

In this preferred embodiment, the Sn-based material part 2 comprises the Sn-based material part base metal doped with the oxidation control element, however, the invention is not limited thereto.

Figure 2:
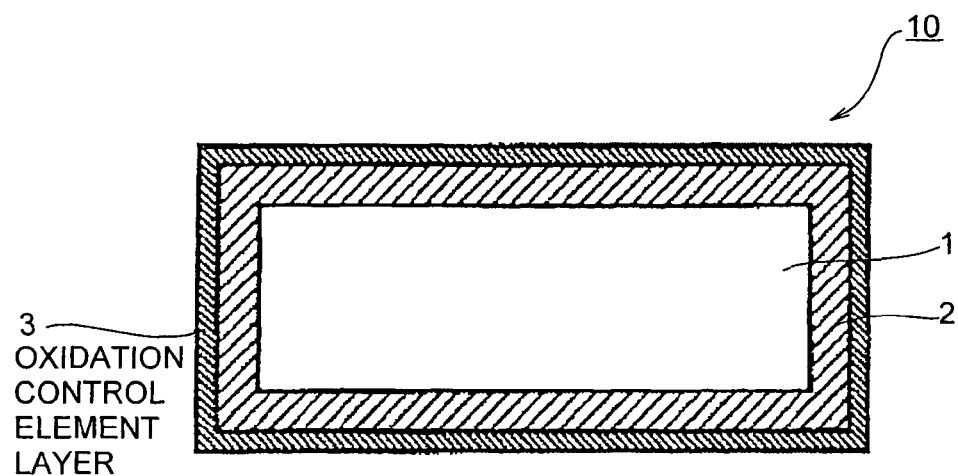
FIG. 2 is a cross sectional view along a widthwise direction of a wiring conductor in a variation of the first preferred embodiment according to the present invention.

For example, FIG. 2 is a cross sectional view along a widthwise direction of a wiring conductor in a variation of the first preferred embodiment. As shown in FIG. 2, an oxidation control element layer 3 may be provided as an outer layer of the Sn-based material part 2 consisted of the Sn-based material part base metal at an outer periphery of the Sn-based material part 2.

Figure 3:
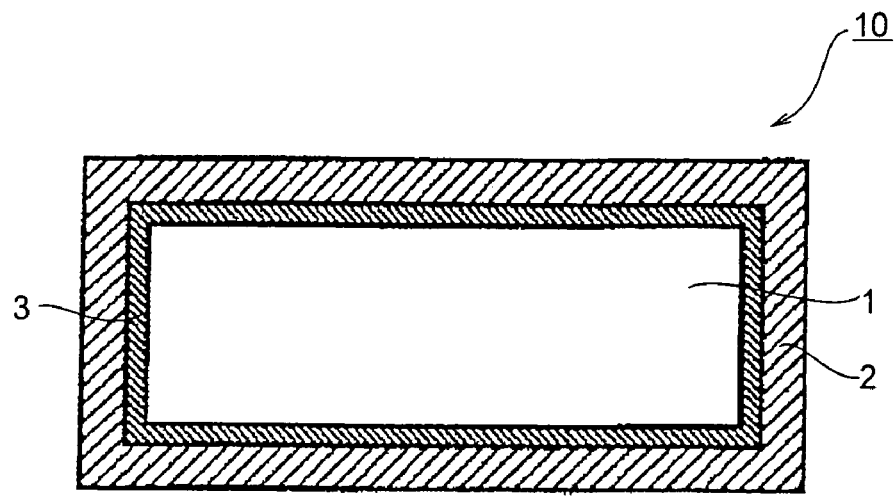
FIG. 3 is a cross sectional view along a widthwise direction of a wiring conductor in another variation of the first preferred embodiment according to the present invention.

FIG. 3 is a cross sectional view along a widthwise direction of a wiring conductor in another variation of the first preferred embodiment. As shown in FIG. 3, an oxidation control element layer 3 may be provided as an inner layer of the Sn-based material part 2 consisted of the Sn-based material part base metal at an inner periphery of the Sn-based material part 2.

By conducting the reflow process on the wiring materials (wiring rods) shown in FIGS. 2 and 3, the wiring conductor in the first preferred embodiment comprising the Sn-based material part which comprises the oxidation control element at least at a part of its surface can be obtained. At least one of the Sn in the Sn-based material part 2 and the oxidation control element constituting the oxidation control element layer is diffused by reflow process, so that a coating layer comprising an alloy composed of the Sn-based material part 2 and the oxidation control element is formed.

Annealing temperature and annealing time of the reflow process are such determined that the temperature and time are enough to diffuse at least one of the Sn in the Sn-based material part 2 and the oxidation control element of the oxidation control element layer 3. Since the annealing temperature and time are varied in accordance with the oxidation control element to be used, the annealing temperature and time are appropriately adjusted in accordance with the oxidation control element to be used.

In addition, the structure of the wiring conductor in the first preferred embodiment may be applied to a terminal of a metallic conductor used for connection. For example, at least one of terminals of the metallic conductors connected with each other may be composed of the wiring conductor in the first preferred embodiment, so that a terminal connecting assembly (terminal connecting part) in a preferred embodiment according to the invention can be provided.

Next, a function of the first preferred embodiment according to the invention will be explained below.

In the first preferred embodiment, the oxidation control element doped to the Sn-based material part base metal is characterized by being oxidized easier than Sn. Particularly in a state where the Sn is melt (in the reflow process), the oxidation control element is oxidized prior to the Sn, and the oxidation control element is volatized from a surface, or the oxidation control element forms a thin oxide film on the surface, so that the Sn provided inside can be prevented from the oxidation. Since this effect is kept in a solidified state, the Sn can be prevented from being oxidized in an environment of normal application and the generation of the whisker can be suppressed.

The oxidation control element is easily oxidized compared with the Sn, even when the oxidation control element is provided inside of the Sn-plating (see the Sn-based material part 2 in FIG. 1), or provided as a backing layer (see the oxidation control element layer 3 in FIG. 3) as well as the oxidation control element is provided at a surface of the Sn-plating (the oxidation control element layer 3 in FIG. 2). Therefore, the oxidation control element moves up to the surface of the Sn-plating to form a thin oxide film at the surface of the Sn-plating by the reflow process, thereby realizing the above effects.

According to the terminal connecting assembly (terminal connecting part) in which at least one of the terminals of the metallic conductors connected with each other comprises the wiring conductor in the first preferred embodiment, the generation of the whisker can be suppressed. For example, by using the wiring conductor in the first preferred embodiment as a wiring material for electronic devices, it is possible to reduce the stress occurred within the Sn-plating provided at a surface of the wiring material for the electronic devices. As a result, the generation of the whisker can be suppressed, and the defects such as the short circuit between adjacent wirings can be suppressed.

Next, a wiring conductor in the second preferred embodiment according to the present invention will be explained below.

As for the wiring conductor as shown in FIG. 1, only the coating layer provided around the core 1 comprises the Sn-based material part 2.

Figure 4:
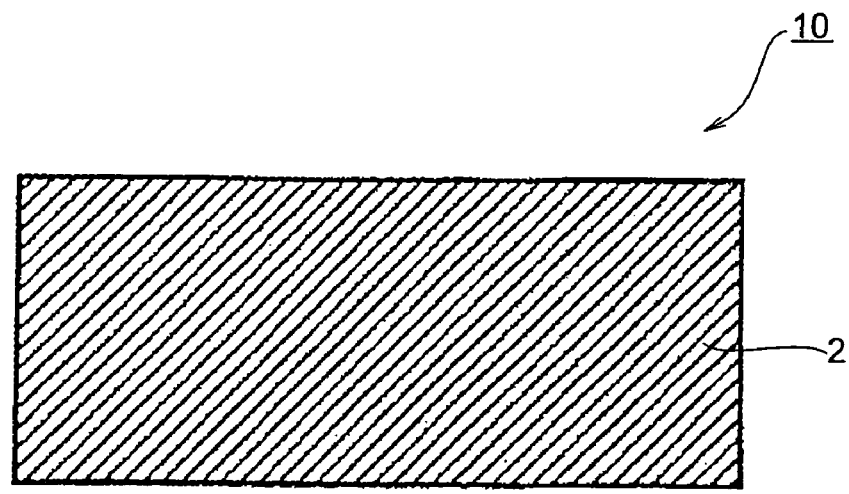
FIG. 4 is a cross sectional view along a widthwise direction of a wiring conductor in a second preferred embodiment according to the present invention.

FIG. 4 is a cross sectional view along a widthwise direction of a wiring conductor in the second preferred embodiment according to the invention.

The wiring conductor in the second preferred embodiment according to the present invention is characterized by that the wiring conductor is totally composed of the Sn-based material part 2.

The wiring conductor in the second preferred embodiment comprises a Pb-free solder material or brazing-filler material in accordance with selection of the Sn-based material part base metal. For example, in a Sn—Ag—Cu solder alloy comprising Ag of 0.1 to 3.5 wt % and Cu of 0.1 to 3.5 wt %, a solder alloy base metal (Sn-based material part base metal) is doped with the oxidation control element of not more than 10 wt %, which comprises at least one element selected from a group consisted of P, Ge, K, Zn, Cr, Mn, Na, V, Si, Ti, Al, Li, Mg, Ca, and Zr, thereby providing the wiring conductor in the second preferred embodiment (a Pb-free solder material), i.e. a Pb-free solder alloy.

By using the Pb-free solder alloy in the second preferred embodiment as a solder connecting part of a terminal of a metallic conductor for example and conducting a reflow process thereon, the terminal connecting part can be connected by soldering. In the terminal connecting part thus obtained, the stress occurred in the soldering material can be reduced. As a result, the generation of the whisker can be suppressed, and defects such as the short circuit between adjacent soldering connecting parts can be avoided.

A wiring conductor in the third preferred embodiment according to the present invention will be explained with referring to FIG. 1.

As a result of zealous studies, the Inventors of the present invention found that the generation of the whisker can be suppressed by suppressing formation of an oxide film at a surface of the Sn by doping the Sn with an appropriate amount of P, Zn, Al, Ti, or V.

In particular, the use of P is preferable, since P is oxidized prior to the Sn in a state where the Sn is melt, and volatilized from the surface, so that the oxide film is hard to be left. The oxidation of the Sn can be suppressed by being doped with Zn, Al, Ti, or V. However, when the doping amount of the oxidation control element such as Zn, Al, Ti, and V is excessive, an oxide film of the doping element is formed to be thick, so that the whisker easily occurs in reverse. The oxide film of the Sn and the doping element can be made thin and the whisker can be suppressed by doping the appropriate amount of the doping element. In addition, it is possible to suppress the oxidation of the Sn, which causes augmentation of the contact resistance particularly in the high temperature environment, by doping the oxidation control element.

In the prior arts, there is a technique for suppressing the generation of the whisker by preventing the oxidation of a surface of Sn by means of a barrier layer formed by absorbing an organic compound at the surface of the Sn, other than the above described technique for suppressing the generation of the whisker by doping the Sn with the oxidation control element. This conventional technique is disclosed by Japanese Patent Laid-Open No. 2004-137574, Japanese Patent Laid-Open No. 2004-156094, etc.

However, according to the method described above, the organic compound adsorbed in the surface of Sn may be partially peeled off due to the mechanical contact, so that there is a risk that the effect of oxidation control cannot be realized enough particularly in a fitting part and a contact part to be connected with a connector. In the third preferred embodiment, the oxidation control element for the Sn is doped into the Sn-plating and distributed inside the Sn-plating. Therefore, even if the wiring conductor is damaged by the mechanical contact, or the wiring conductor is fitted or contacted with the connector, the oxidation control effect can be realized stably.

In the third preferred embodiment, a wiring conductor 10 comprises a conductive material (core) 1 and a Sn-based material part (coating layer) 2 provided around the core 1 for plating the core 1, and the Sn-based material part 2 comprises a Sn-based material part base metal doped with the oxidation control element, which comprises at least one element selected from a group consisted of P, Zn, Al, Ti, and V.

As for the Sn-based material part base metal, a pure Sn-based material comprising Sn and unavoidable impurities, a Pb-free solder material or brazing-filler material such as a Sn—Ag based material, a Sn—Ag—Cu based material, a Sn—Bi based material, a Sn—Bi—Ag based material, a Sn—Cu based material may be used.

The doping amount of P to be doped to the Sn-based material part base metal is preferably not less than 0.002 wt %, since the oxidation control effect cannot be obtained if the doping amount is less than 0.002 wt %. On the other hand, the doping amount of P is preferably not more than 0.5 wt %, since the defects such as the generation of cracks may occur if the doping amount is more than 0.5 wt %. It is more preferable that the doping amount of P is 0.005 to 0.05 wt %.

The doping amount of Zn to be doped to the Sn-based material part base metal is preferably not less than 0.002 wt %, since the oxidation control effect cannot be obtained if the doping amount is less than 0.002 wt %. On the other hand, the doping amount of Zn is preferably not more than 0.5 wt %, since the defects such as the generation of cracks may occur if the doping amount is more than 0.5 wt %. It is more preferable that the doping amount of Zn is 0.01 to 0.10 wt %.

The doping amount of Al to be doped to the Sn-based material part base metal is preferably not less than 0.002 wt %, since the oxidation control effect cannot be obtained if the doping amount is less than 0.002 wt %. On the other hand, the doping amount of Al is preferably not more than 0.008 wt %, since the defects such as the generation of cracks may occur if the doping amount is more than 0.008 wt %. It is more preferable that the doping amount of P is 0.003 to 0.007 wt %.

The doping amount of Ti to be doped to the Sn-based material part base metal is preferably not less than 0.002 wt %, since the oxidation control effect cannot be obtained if the doping amount is less than 0.002 wt %. On the other hand, the doping amount of Ti is preferably not more than 0.05 wt %, since the defects such as the generation of cracks may occur if the doping amount is more than 0.05 wt %. It is more preferable that the doping amount of Ti is 0.005 to 0.010 wt %.

The doping amount of V to be doped to the Sn-based material part base metal is preferably not less than 0.002 wt %, since the oxidation control effect cannot be obtained if the doping amount is less than 0.002 wt %. On the other hand, the doping amount of V is preferably not more than 0.1 wt %, since the defects such as the generation of cracks may occur if the doping amount is more than 0.1 wt %. It is more preferable that the doping amount of V is 0.005 to 0.010 wt %.

As for the metallic material constituting the core 1, a conductive material having a conductance of not less than 10% IACS, an oxygen-free copper, a tough pitch copper, a silver, a nickel, a Cu-based alloy material, a Ni-based alloy base metal, an Al-based alloy material or a ferrous alloy material may be used.

As for shape and form of the core 1, a circular wire rod, an angular wire rod, a plate material, a strip material, or a foil material may be used, however, the present invention is not limited thereto.

In Sn fusion plating, doping of P, Zn, Al, Ti, or V is easy. Zn can be also doped by electroplating. P can be also doped by electroplating. By doping phosphorous acid ($H_2PO_2$) in a ratio of 1 to 20 g/liter to the Sn-plating bath, P can be doped to a precipitated Sn-plating.

According to the terminal connecting assembly (terminal connecting part) in which at least one of the terminals of the metallic conductors connected with each other comprises the wiring conductor in the third preferred embodiment, the generation of the whisker can be suppressed. For example, when a conductor terminal of a wiring material and a connector pin of a connector are fitted or connected with each other, at least one of terminals (conductor terminal and connector pin) may be composed of the wiring conductor in the third preferred embodiment to provide the terminal connecting assembly. When a conductor terminal of the wiring material and a conductor terminal of another wiring material are fitted or connected with each other, at least one of the conductor terminals may be composed of the wiring conductor in the third preferred embodiment to provide the terminal connecting assembly.

EXAMPLE 1

16 kinds of samples of wiring material (wiring conductor) were prepared. In the sample, a pure Sn is doped with 0.01 wt % of P, Cr, V, Si, Ti, Mn, Zr, Ca or Ge, or 0.1 wt % of K, Na, Al, Li, Mg or Zn to provide a Sn alloy, respectively. By using the Sn alloys thus obtained, the fusion Sn-plating is conducted on the wiring materials to provide Examples 1 to 15. On the other hand, the fusion Sn-plating is conducted on the wiring material by using a pure Sn to provide a Comparative example 1.

In a state where each of the wiring materials is fitted into a connector, a normal room temperature leaving test (20° C.×1000 hr), a thermal shock test (−55° C. to 125° C.×1000 cycles), and a humidity resistance leaving test (55° C., 85% RH×1000 hr) were carried out. Thereafter, each of the wiring materials was detached from the connector, and a status of generation of whisker at a plating film surface in a connector fitting part (connecting part) was observed by means of electron microscope.

TABLE 1 shows an evaluation result of whisker resistance property of the wiring material after respective tests. In TABLE 1, ⊚ indicates "no whisker", ○ indicates that a length of the whisker is less than 50 μm, and × indicates a length of the whisker is not less than 50 μm.

TABLE 1

| Example | | Doping metal | Doping ratio (wt %) | Whisker resistance property | | |
|---|---|---|---|---|---|---|
| | | | | Room temperature leaving test | Thermal shock test | Humidity resistance leaving test |
| Example 1 (Pure Sn is doped with respective elements) | 1 | P | 0.01 | ⊚ | ⊚ | ⊚ |
| | 2 | Cr | 0.01 | ⊚ | ⊚ | ⊚ |
| | 3 | V | 0.01 | ⊚ | ⊚ | ⊚ |
| | 4 | Si | 0.01 | ○ | ○ | ○ |
| | 5 | Ti | 0.01 | ⊚ | ⊚ | ⊚ |
| | 6 | Mn | 0.01 | ○ | ○ | ○ |
| | 7 | Zr | 0.01 | ○ | ○ | ○ |
| | 8 | Ca | 0.01 | ○ | ○ | ○ |
| | 9 | Ge | 0.01 | ⊚ | ⊚ | ⊚ |
| | 10 | K | 0.1 | ○ | ○ | ○ |
| | 11 | Na | 0.1 | ○ | ○ | ○ |
| | 12 | Al | 0.1 | ⊚ | ⊚ | ⊚ |
| | 13 | Li | 0.1 | ○ | ○ | ○ |
| | 14 | Mg | 0.1 | ⊚ | ⊚ | ⊚ |
| | 15 | Zn | 0.1 | ⊚ | ⊚ | ⊚ |
| Comparative Example (Pure Sn) | 1 | None | — | X | X | X |

⊚ no whisker,
○ the length of whisker is less than 50 μm,
X the length of whisker is not less than 50 μm As shown in TABLE 1, compared with the wiring material of the Comparative example 1 using the pure Sn doped with no oxidation control element, the effect of suppressing the whicker can be obtained in all the wiring materials using the pure Sn doped with the oxidation control element of the Examples 1 to 15.

The respective wiring materials of the Examples 1 to 15 may be applied to the FFC or the like.

EXAMPLE 2

16 kinds of Samples of a wiring material (wiring conductor) were prepared. In the sample, a Sn-3Ag-0.5Cu alloy (a Pb-free solder) is doped with 0.01 wt % of P, Cr, V, Si, Ti, Mn, Zr, Ca, or Ge, or 0.1 wt % of K, Na, Al, Li, Mg, or Zn to provide a Sn alloy, respectively. By using the Pb-free Sn-3Ag-0.5Cu alloys thus obtained, the fusion Sn-plating is conducted on the wiring materials to provide Examples 21 to 35. On the other hand, the fusion Sn-plating is conducted on the wiring material by using undoped Sn-3Ag-0.5Cu alloy to provide a Comparative example 2.

In a state where each of the wiring materials is fitted into a connector, a normal room temperature leaving test (20° C.×1000 hr), a thermal shock test (−55° C. to 125° C.×1000 cycles), and a humidity resistance leaving test (55° C., 85% RH×1000 hr) were carried out. Thereafter, each of the wiring materials was detached from the connector, and a status of generation of whisker at a plating film surface in a connector fitting (connecting) part was observed by means of the electron microscope.

TABLE 2 shows an evaluation result of whisker resistance property of the wiring material after respective tests. In TABLE 2, ⊚ indicates "no whisker", ○ indicates that a length of the whisker is less than 50 μm, and × indicates a length of the whisker is not less than 50 μm.

TABLE 2

| Example | | Doping metal | Doping ratio (wt %) | Whisker resistance property | | |
|---|---|---|---|---|---|---|
| | | | | Room temperature leaving test | Thermal shock test | Humidity resistance leaving test |
| Example 2 (Sn—3Ag—0.5Cu is doped with respective elements) | 21 | P | 0.01 | ⊚ | ⊚ | ⊚ |
| | 22 | Cr | 0.01 | ⊚ | ⊚ | ⊚ |
| | 23 | V | 0.01 | ○ | ○ | ○ |
| | 24 | Si | 0.01 | ○ | ○ | ○ |
| | 25 | Ti | 0.01 | ○ | ○ | ○ |
| | 26 | Mn | 0.01 | ○ | ○ | ○ |
| | 27 | Zr | 0.01 | ○ | ○ | ○ |
| | 28 | Ca | 0.01 | ○ | ○ | ○ |
| | 29 | Ge | 0.01 | ○ | ○ | ○ |
| | 30 | K | 0.1 | ○ | ○ | ○ |
| | 31 | Na | 0.1 | ○ | ○ | ○ |
| | 32 | Al | 0.1 | ⊚ | ⊚ | ⊚ |
| | 33 | Li | 0.1 | ○ | ○ | ○ |
| | 34 | Mg | 0.1 | ○ | ○ | ○ |
| | 35 | Zn | 0.1 | ⊚ | ⊚ | ⊚ |
| Comparative Example (Sn—3Ag—0.5Cu) | 2 | None | — | X | X | X |

⊚ no whisker,
○ the length of whisker is less than 50 μm,
X the length of whisker is not less than 50 μm As shown in TABLE 2, compared with the wiring material of the Comparative example 2 using the Sn-3Ag-0.5Cu alloy doped with no oxidation control element, the effect of suppressing the whicker can be obtained in all the wiring materials using the Sn-3Ag-0.5Cu alloy (Pb-free solder) doped with the oxidation control element of the Examples 21 to 35.

The respective wiring materials of the Examples 21 to 35 may be used as a soldering material, since a melting point of the wiring material in the respective Examples 21 to 35 is lower than that of the wiring material in the respective Examples 1 to 15.

EXAMPLE 3

A fusion plating bath of undoped pure Sn and a fusion plating bath of Sn alloy doped with an arbitrary doping amount of P, Zn, Al, Ti or V were prepared and kept at a temperature of 300° C.

Subsequently, the fusion plating was respectively conducted on a Cu plate having a width of 5 mm and a thickness of 0.3 mm by using the fusion plating bath thus prepared to have a thickness of 8 to 10 μm, and the plated Cu plate was cut to have a length of 2.5 cm to provide a plated strip (sample). The plated strip (sample) was fitted and contacted with a connector having a pitch of 0.5mm and 50 pins (composed of phosphor bronze). Thereafter, a slider was inserted under the plated strip (sample), and a compressive stress was applied thereto.

In this state, a normal room temperature leaving test (20° C., 60% RH, 1000 hr), a temperature alteration test (−55° C. to +125° C., 1000 cycles) and a high temperature and high humidity test (55° C., 85% RH, 2000 hr) were carried out.

Thereafter, each of the wiring materials was detached from the connector, and a status of generation of whisker at a plating film surface in a connector fitting part (connecting part) was observed by means of the electron microscope. At connecting parts (50 places), observation data of the number of the whisker and the distribution of the whisker having a predetermined length were obtained.

TABLE 3 shows an evaluation result of whisker resistance property of the wiring material after respective tests. In TABLE 3, ⊚ indicates that the maximum length of the whisker is less than 10 μm, ○ indicates that the maximum length of the whisker is not less than 10 μm and less than 50 μm, Δ indicates that the maximum length of the whisker is not less than 50 μm and less than 100 μm, and × indicates that the maximum length of the whisker is not less than 100 μm.

TABLE 3

| Fusion-soldering Bath | Doping element | Doping Concentration (wt %) | Whisker resistance property | | |
|---|---|---|---|---|---|
| | | | Room temperature Leaving test | Thermal shock test | Humidity resistance leaving test |
| Sn | None | — | X | X | X |
| | P | 0.001 | X | Δ | X |
| | | 0.002 | ○ | ○ | ○ |
| | | 0.005 | ⊚ | ⊚ | ⊚ |
| | | 0.010 | ⊚ | ⊚ | ⊚ |
| | | 0.050 | ⊚ | ⊚ | ⊚ |
| | | 0.10 | ○ | ○ | ○ |
| | | 0.50 | ○ | ○ | ○ |
| | | 1.00 | Δ | Δ | Δ |
| | Zn | 0.001 | Δ | Δ | Δ |
| | | 0.002 | ○ | ○ | ○ |
| | | 0.01 | ⊚ | ⊚ | ⊚ |
| | | 0.10 | ⊚ | ○ | ○ |
| | | 0.5 | ○ | ○ | ○ |
| | | 1.0 | X | X | X |
| | Al | 0.001 | Δ | Δ | Δ |
| | | 0.002 | ○ | ○ | ○ |
| | | 0.005 | ⊚ | ○ | ○ |
| | | 0.008 | ○ | ○ | ○ |
| | | 0.010 | Δ | X | X |
| | Ti | 0.001 | Δ | Δ | X |
| | | 0.002 | ○ | ○ | ○ |
| | | 0.005 | ⊚ | ○ | ○ |
| | | 0.010 | ⊚ | ○ | ○ |
| | | 0.050 | ○ | ○ | ○ |
| | | 0.10 | Δ | Δ | Δ |
| | V | 0.001 | Δ | Δ | X |
| | | 0.002 | ○ | ○ | ○ |
| | | 0.005 | ⊚ | ○ | ○ |
| | | 0.010 | ⊚ | ○ | ○ |
| | | 0.050 | ○ | ○ | ○ |
| | | 0.10 | ○ | ○ | ○ |
| | | 0.50 | Δ | X | X |

⊚: the maximum length of whisker is less than 10 μm
○: the maximum length of whisker is not less than 10 μm and less than 50 μm
Δ: the maximum length of whisker is not less than 50 μm and less than 100 μm
X: the maximum length of whisker is not less than 100 μm As shown in TABLE 3, when any doping element is not doped, the whisker cannot be suppressed.

In addition, the whisker suppressing effect cannot be obtained enough, when a doping concentration of the doping element was less than 0.002 wt %. On the other hand, an upper limit of the doping concentration of the doping element is varied in accordance with the doping element. The upper limit is 0.50 wt % for doping P, 0.50 wt % for Zn, 0.008 wt % for Al, 0.050 wt % for Ti, 0.10 wt % for V, respectively. When the doping concentration exceeds the upper limit of the respective elements, the whisker resistance property was reversely deteriorated.

Figure 5:
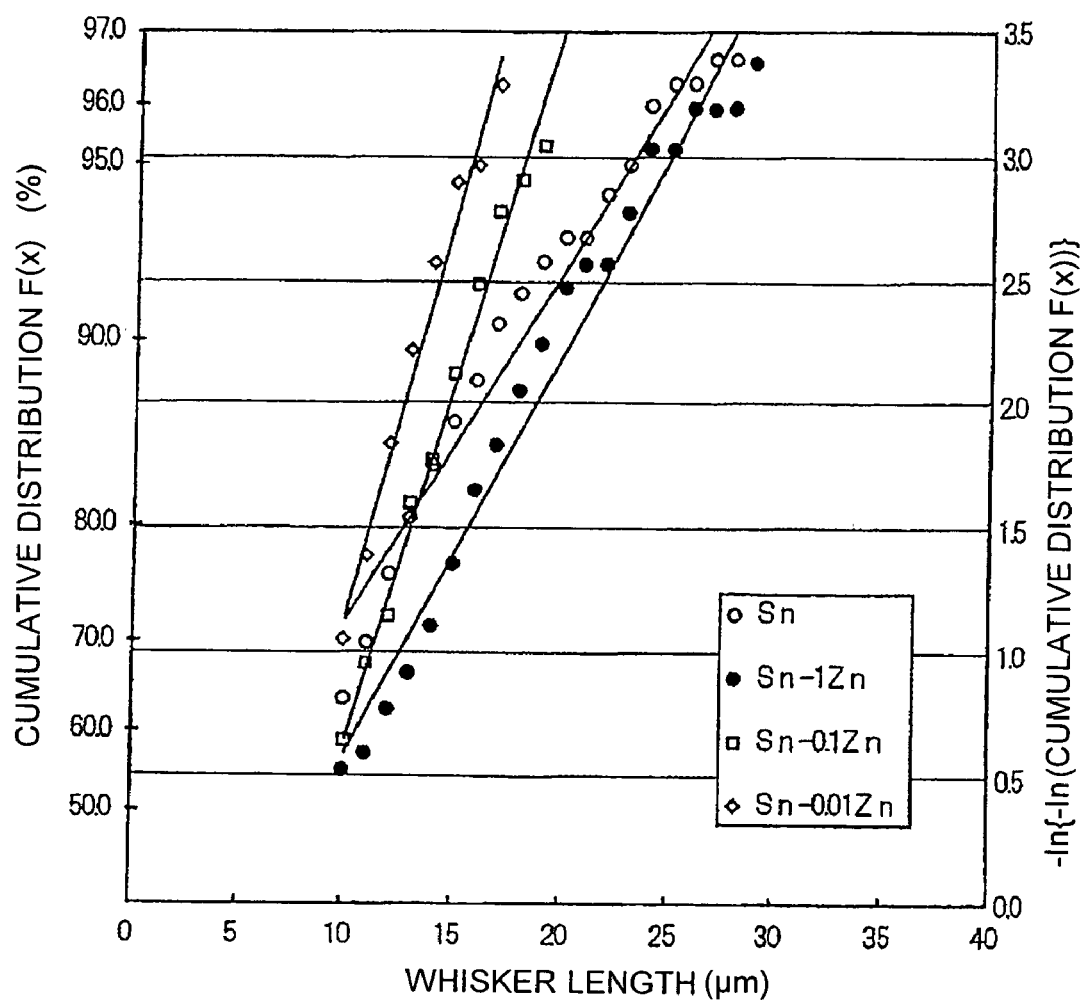
FIG. 5 is a graph showing a relationship between the maximum whisker length and a cumulative distribution for each pin in Example 3.

FIG. 5 is a graph in which the maximum whisker length for each pin of 300 pins (50 pin connector×6) composed of Sn-0.01 wt % Zn, Sn-0.1 wt % Zn, Sn-1 wt % Zn and pure Sn are analyzed by extreme value statistics.

As shown in FIG. 5, it is assumed that a cumulative distribution of the maximum whisker length for each pin is determined in accordance with Gumbel distribution of extreme value theory shown in following Formula 1. In fact, by taking logarithm twice for the cumulative distribution F(x) [%], the result was linear. As described above, it is understood that the whisker resistance property is deteriorated when the doping concentration of the doping element is excessive.

FORMULA 1

The cumulative distribution function of Gumbel distribution is:

$$F_1(x) = \exp[-\exp\{-(x*\lambda)/\alpha\}],$$

wherein α is a spread parameter and λ is a location parameter.

By taking Napierian logarithm of both sides twice:

$$-\ln\{-\ln F_1(x)\} = (x*\lambda)/\alpha.$$

By defining $y = -\ln\{-\ln F_1(x)\}$, $$y = (1/\alpha)*(\lambda/\alpha).$$

EXAMPLE 4

Respective fusion plating baths of Sn-3wt % Ag-0.5 wt % Cu alloy, Sn-5wt % Bi alloy, and Sn-0.7wt % Cu alloy, which are Pb-free solders and undoped, and respective fusion plating baths of Sn-3wt % Ag-0.5 wt % Cu alloy, Sn-5 wt % Bi alloy, and Sn-0.7 wt % Cu alloy respectively doped with P, Zn, Al, Ti or V were prepared and kept at a temperature of 300° C.

Subsequently, the fusion plating was respectively conducted on a Cu plate having a width of 5 mm and a thickness of 0.3 mm by using the fusion plating bath thus prepared to have a thickness of 8 to 10 μm, and the plated Cu plate was cut to have a length of 2.5 cm to provide a plated strip (sample). The plated strip (sample) was fitted and contacted with a connector having a pitch of 0.5 mm and 50 pins (composed of phosphor bronze). Thereafter, a slider was inserted under the plated strip (sample), and a compressive stress was applied thereto.

In this state, a normal room temperature leaving test (20° C., 60% RH, 1000 hr), a temperature alteration test (−55° C. to +125° C., 1000 cycles) and a high temperature and high humidity test (55° C., 85% RH, 2000 hr) were carried out.

Thereafter, each of the wiring materials was detached from the connector, and a status of generation of whisker at a plating film surface in a connector fitting part (connecting part) was observed by means of the electron microscope. At connecting parts (50 pieces), observation data of the number and distribution of the whisker having a predetermined length was obtained.

TABLE 4 shows an evaluation result of whisker resistance property of the wiring material after respective tests. In TABLE 4, ⊚ indicates that the maximum length of the whisker is less than 10 μm, ○ indicates that the maximum length of the whisker is not less than 10 μm and less than 50 μm, Δ indicates that the maximum length of the whisker is not less than 50 μm and less than 100 μm, and × indicates that the maximum length of the whisker is not less than 100 μm.

TABLE 4

| Fusion-soldering Bath | Doping element | Doping Concentration (wt %) | Whisker resistance property | | |
|---|---|---|---|---|---|
| | | | Room temperature leaving test | Thermal shock test | Humidity resistance leaving test |
| Sn—3Ag—0.5Cu | None | — | X | X | X |
| | P | 0.010 | ⊚ | ⊚ | ⊚ |
| | Zn | 0.010 | ⊚ | ⊚ | ○ |
| | Al | 0.005 | ⊚ | ⊚ | ⊚ |
| | Ti | 0.010 | ⊚ | ○ | ○ |
| | V | 0.010 | ⊚ | ⊚ | ○ |
| Sn—5Bi | None | — | X | X | X |
| | P | 0.010 | ⊚ | ⊚ | ⊚ |
| | Zn | 0.010 | ⊚ | ⊚ | ○ |
| | Al | 0.005 | ○ | ○ | ○ |
| | Ti | 0.010 | ⊚ | ○ | ○ |
| | V | 0.010 | ⊚ | ○ | ○ |
| Sn—0.7Cu | None | — | X | X | X |
| | P | 0.010 | ⊚ | ⊚ | ⊚ |
| | Zn | 0.010 | ⊚ | ○ | ○ |
| | Al | 0.005 | ⊚ | ○ | ⊚ |
| | Ti | 0.010 | ○ | ○ | ○ |
| | V | 0.010 | ○ | ○ | ○ |

⊚: the maximum length of whisker is less than 10 μm
○: the maximum length of whisker is not less than 10 μm and less than 50 μm
Δ: the maximum length of whisker is not less than 50 μm and less than 100 μm
X: the maximum length of whisker is not less than 100 μm As shown in TABLE 4, as for the Sn—Ag—Cu based Pb-free solder material, Sn—Bi based Pb-free solder material, and Sn—Cu based Pb-free solder material, when the doping element is not doped thereto, the whisker is grown to have a length of not less than 100 μm due to fitting and contacting with the connector. On the other hand, it is confirmed that the generation of the whisker can be suppressed by doping P, Zn, Al, Ti, or V with an appropriate concentration, respectively.

EXAMPLE 5

A fusion plating bath of undoped pure Sn and fusion plating baths of Sn alloy doped with an arbitrary doping amount of P, Zn, Al, Ti or V respectively were prepared and kept at a temperature of 300° C.

Subsequently, the fusion plating was respectively conducted on a Cu plate having a width of 5 mm and a thickness of 0.3 mm by using the fusion plating bath thus prepared to have a thickness of 8 to 10 μm, and the plated Cu plate was cut to have a length of 2.5 cm to provide a plated strip (sample). The plated strip (sample) was fitted and contacted with a connector having a pitch of 0.5 mm and 50 pins (composed of phosphor bronze). Then, the samples were left in the environment at a temperature of 85° C. A contact resistance at an initial state (0 hour), after 100 hours, 200 hours, 500 hours, 1000 hours, 1500 hours, and 2000 hours, 3000 hours were measured, and differences from the initial state were compared.

Figure 6:
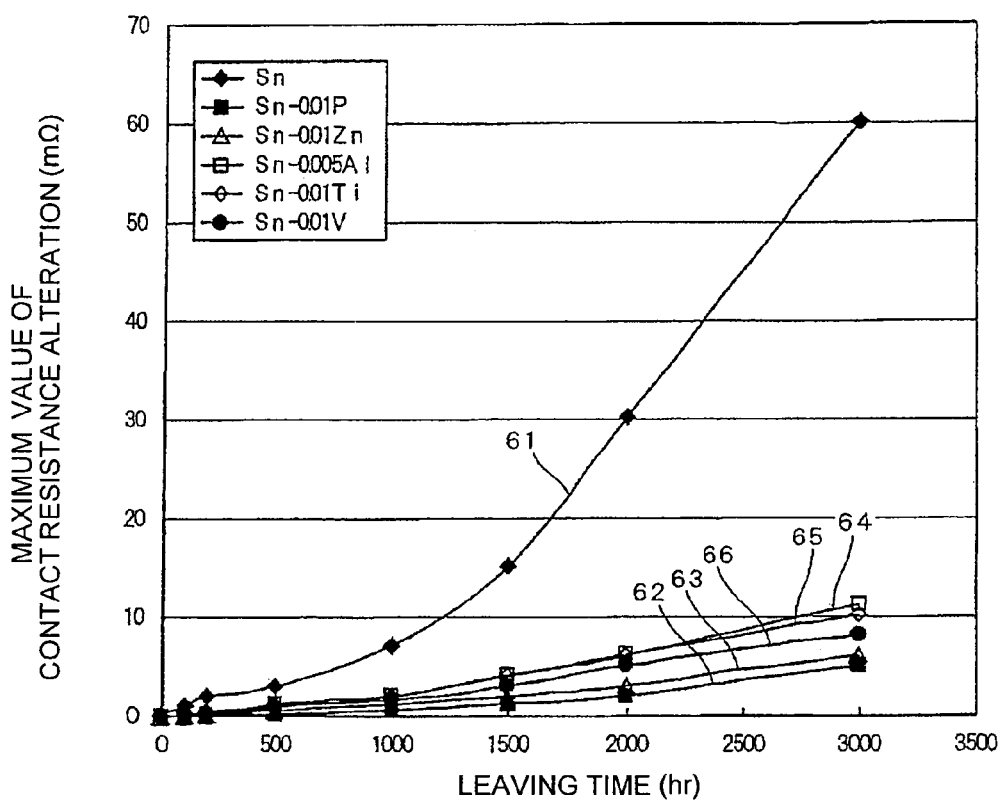
FIG. 6 is a graph showing a relationship between a leaving time and a maximum value of a contact resistance alteration in a leaving test under 85° C. environment in Example 5.
Figure 7:
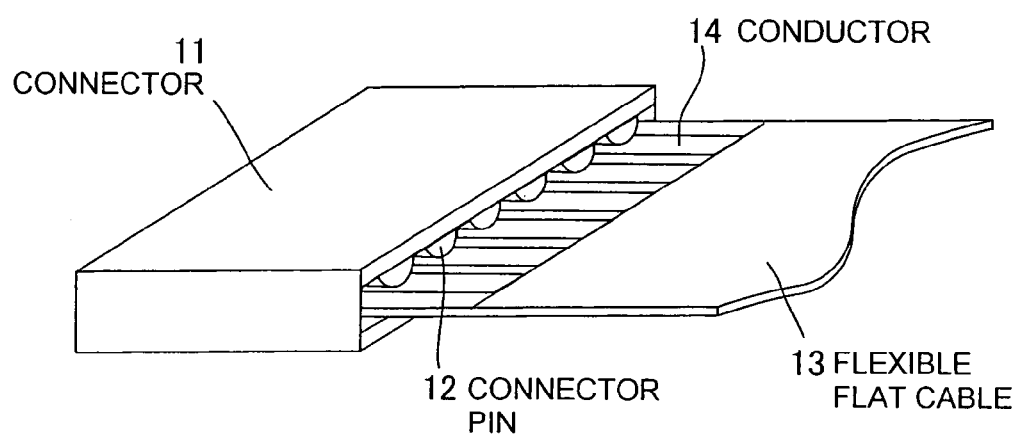
FIG. 7 is a schematic diagram showing an example where a FFC is fitted into a connector.
Figure 8:
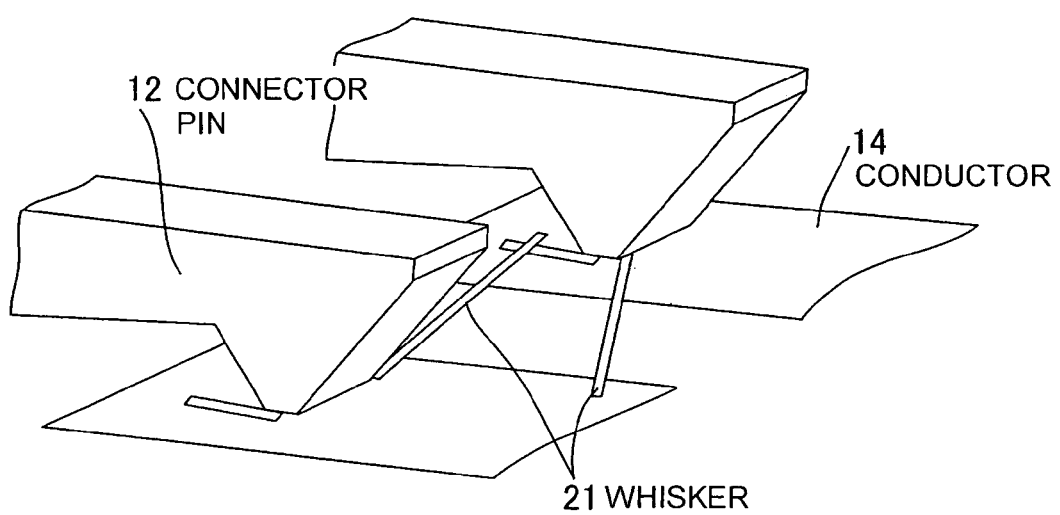
FIG. 8 is a schematic diagram of a fitting part between connector pins and wirings, wherein whiskers are generated and adjacent wirings are short-circuited.

FIG. 6 shows a maximum value of the contact resistance alteration obtained for each leaving time.

As shown in FIG. 6, in cases where P, Zn, Al, Ti or V of optimum doping amount is doped (lines 62 to 66), the augmentation of the contact resistance can be significantly suppressed, compared with the cases where any doping element is not doped (consisted of Sn, line 61). The augmentation of the contact resistance is caused by the growth of the Sn oxide film having a large resistance value on the surface of the Sn. It is assumed that the growth of the Sn oxide film can be suppressed by doping the optimum amount of P, Zn, Al, Ti or V, thereby suppressing the augmentation of the contact resistance.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A wiring conductor for engagement into a connector member comprising:
    a Pb-free Sn-based material part provided at least at a part of its surface, the Sn-based material part comprising a base metal doped with an oxidation control element comprising at least one element selected from a group consisted of P, Ge, K, Zn, Cr, Mn, Na, V, Si, Ti, Al, Li, Mg, Zr, and Ca, wherein at least one of the Sn and the oxidation control element is diffused to provide an oxidized surface on the Sn-based material part, wherein the oxidation control element oxidizes before the Sn oxidizes, and the oxidation control element that provides the oxidized surface substantially eliminates whisker formation as the wiring conductor is engaged to the connector member.

2. The wiring conductor according to claim 1, wherein:
    at least one of the Sn and the oxidation control element is diffused by a reflow process.

3. The wiring conductor according to claim 1 further comprising:
at least one of Ti and Zr as the oxidation control element.

4. The wiring conductor according to claim 1, wherein:
the oxidation control element is contained in an outer layer provided at an outer periphery of the Sn-based material part.

5. The wiring conductor according to claim 1, wherein:
the oxidation control element is contained in an inner layer provided at an inner periphery of the Sn-based material part.

6. The wiring conductor according to claim 1, wherein:
a total doping amount of the oxidation control element doped to the base metal of the Sn-based material part is not more than 10 wt %.

7. The wiring conductor according to claim 1 further comprising:
a core composed of Cu-based material;
wherein the core is coated with a coating layer composed of the Sn-based material part.

8. The wiring conductor according to claim 1, wherein:
the wiring conductor is provided as a Pb-free solder material or brazing-filler material totally composed of the Sn-based material part.

9. The wiring conductor of claim 1, wherein the oxidation control element is selected from the group consisting of P, Cr, V, Ti, Ge, Al, Mg and Zn, and is present in a concentration no greater than 0.1%.

10. A wiring member comprising:
a terminal comprising a wiring conductor for engagement into a connector member,
wherein the wiring conductor comprises a Pb-free Sn-based material part at least at a part of its surface, the Sn-based material part comprises a base metal doped with an oxidation control element comprising at least one element selected from a group consisted of P, Ge, K, Zn, Cr, Mn, Na, V, Si, Ti, Al, Li, Mg and Ca, and at least one of the Sn and the oxidation control element is diffused to provide an oxidized surface on the Pb-free Sn-based material part, wherein the oxidation control element oxidizes before the Sn oxidizes, and the oxidization control element that provides the oxidized surface substantially eliminates whisker formation as the wiring conductor is engaged to the connector member.

11. The wiring member according to claim 10, wherein:
the wiring member is a flexible flat cable.

12. The wiring member according to claim 10, wherein:
the wiring member is a connector having a connector pin as the terminal.

13. The wiring member of claim 10, wherein the oxidation control element is selected from the group consisting of P, Cr, V, Ti, Ge, Al, Mg and Zn, and is present in a concentration no greater than 0.1%.

14. A connecting assembly comprising:
a first terminal to be connected to a second terminal, the first terminal comprising a wiring conductor for engagement into a connector member of the second terminal,
wherein the wiring conductor comprises a Pb-free Sn-based material part provided at least at a part of its surface, the Sn-based material part comprises a base metal doped with an oxidation control element comprising at least one element selected from a group consisted of P, Ge, K, Zn, Cr, Mn, Na, V, Si, Ti, Al, Li, Mg and Ca, and at least one of the Sn and the oxidation control element is diffused to provide an oxidized surface on the Pb-free Sn-based material part wherein the oxidation control element oxidizes before the Sn oxidizes, and the oxidization control element that provides the oxidized surface substantially eliminates whisker formation as the wiring conductor is engaged to the connector member.

15. The connecting assembly of claim 14, wherein the oxidation control element is selected from the group consisting of P, Cr, V, Ti, Ge, Al, Mg and Zn, and is present in a concentration no greater than 0.1%.

16. A wiring conductor for engagement into a connector member comprising:
a composite material of a Pb-free Sn-based material part provided at least at its surface and a metallic material as a core, wherein a base metal of the Sn-based material part is doped with at least one oxidation control element selected from a group consisted of P, Zn, Al, Ti, and V, wherein the oxidation control element is present in a concentration ranging from 0.001 wt % to 0.5 wt % and substantially limits whisker formation to a maximum length of less than 10 microns.

17. The wiring conductor according to claim 16, wherein:
the base metal of the Sn-based material part comprises a Pb-free solder material or brazing-filler material comprising a pure Sn-based material composed of Sn and inevitable impurities, a Sn—Ag based material, a Sn—Ag—Cu-based material, a Sn—Bi based material, a Sn—Bi—Ag based material, or a Sn—Cu-based material.

18. The wiring conductor according to claim 14, wherein:
a doping amount of an element doped to the base metal of the Sn-based material part is from 0.002 to 0.5 wt % when the element is P or Zn.

19. The wiring conductor according to claim 16, wherein:
a doping amount of an element doped to the base metal of the Sn-based material part is from 0.002 to 0.008 wt % when the element is Al.

20. The wiring conductor according to claim 16, wherein:
a doping amount of an element doped to the base metal of the Sn-based material part is from 0.002 to 0.5 wt % when the element is Ti.

21. The wiring conductor according to claim 16, wherein:
a doping amount of an element doped to the base metal of the Sn-based material part is from 0.002 to 0.1 wt % when the element is V.

22. The wiring conductor according to claim 16, wherein:
the core comprises a metallic material comprising a conductive material having a conductance of not less than 10% IACS, an oxygen-free copper, a tough pitch copper, a silver, a nickel, a Cu-based alloy material, a Ni-based alloy base metal, an Al-based alloy material or a Fg-based alloy material.

23. The wiring conductor according to claim 16, wherein:
the core comprises a circular wire rod, a rectangular wire rod, a plate material, a strip material, or a foil material.

* * * * *